United States Patent [19]

Garrett

[11] Patent Number: 4,518,078

[45] Date of Patent: May 21, 1985

[54] WAFER TRANSPORT SYSTEM

[75] Inventor: Charles B. Garrett, San Jose, Calif.

[73] Assignee: Varian Associates, Inc., Palo Alto, Calif.

[21] Appl. No.: 634,175

[22] Filed: Jul. 24, 1984

Related U.S. Application Data

[63] Continuation of Ser. No. 381,022, May 24, 1982, abandoned.

[51] Int. Cl.³ ............................................. B65G 25/00
[52] U.S. Cl. ..................................... 198/775; 198/619
[58] Field of Search ............... 198/619, 621, 653, 773, 198/774, 775, 719, 742, 656; 414/749, 750; 118/500, 719, 729

[56] References Cited

U.S. PATENT DOCUMENTS

| | | | |
|---|---|---|---|
| 2,609,915 | 9/1952 | Burgh | 198/619 |
| 2,997,979 | 8/1961 | Tassara | 118/730 |
| 3,202,406 | 8/1965 | Tack | 198/619 |
| 3,704,775 | 12/1972 | Eickenhorst | 198/621 |
| 3,782,561 | 1/1974 | Orii | 198/621 |
| 3,973,665 | 8/1976 | Giammanco | 198/861 |
| 4,042,093 | 8/1977 | Fujii et al. | 198/742 |
| 4,273,507 | 6/1981 | Herdzina et al. | 414/750 |

OTHER PUBLICATIONS

"Air Powered Linear Transporter Uses Rare-Earth Magnets", Feb. 1978, Engineering Materials and Design (Great Britain), vol. 22, No. 2.

Primary Examiner—Joseph E. Valenza
Assistant Examiner—Daniel R. Alexander
Attorney, Agent, or Firm—Stanley Z. Cole; Kenneth L. Warsh

[57] ABSTRACT

A wafer transport system for use in in-line sputtering systems having a first magnet exterior to a process chamber and a second magnet in the process chamber connected to wafer support arms carrying wafers such that the magnetic coupling between the magnets permits the positioning of the wafer support arms in a desired location by movement of the exterior magnet.

9 Claims, 6 Drawing Figures

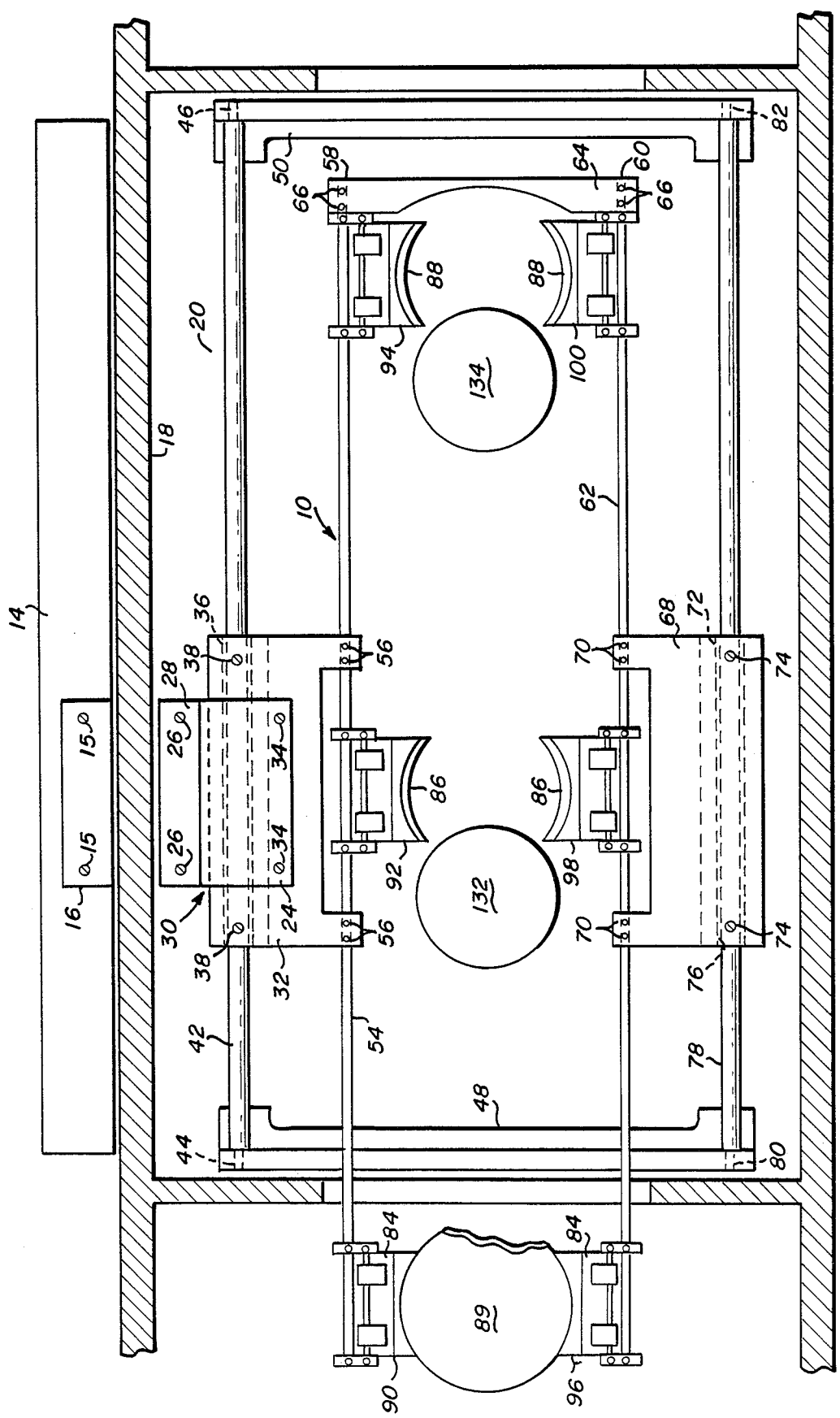
Fig_1

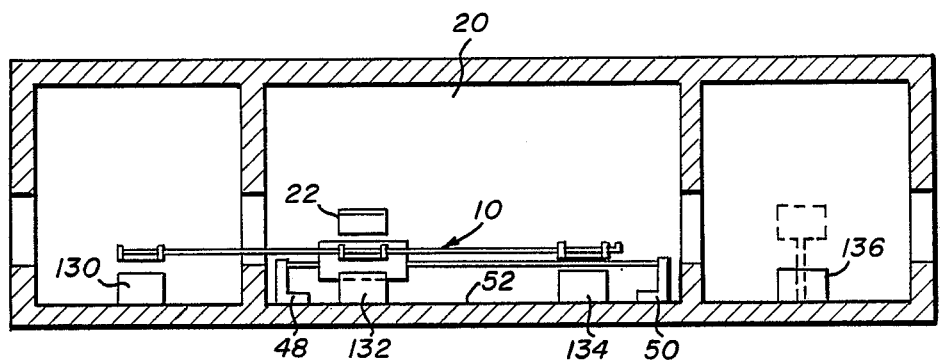
Fig_2
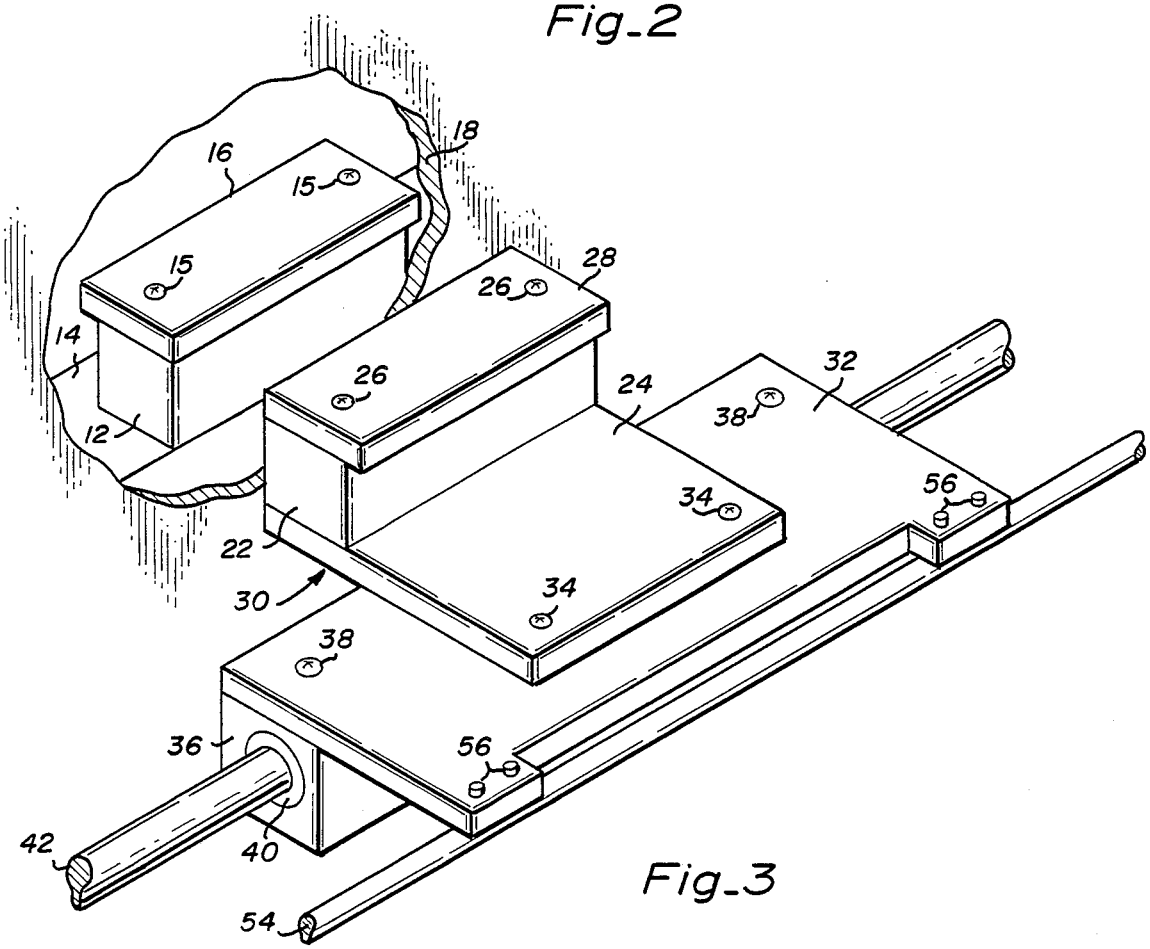
Fig_3

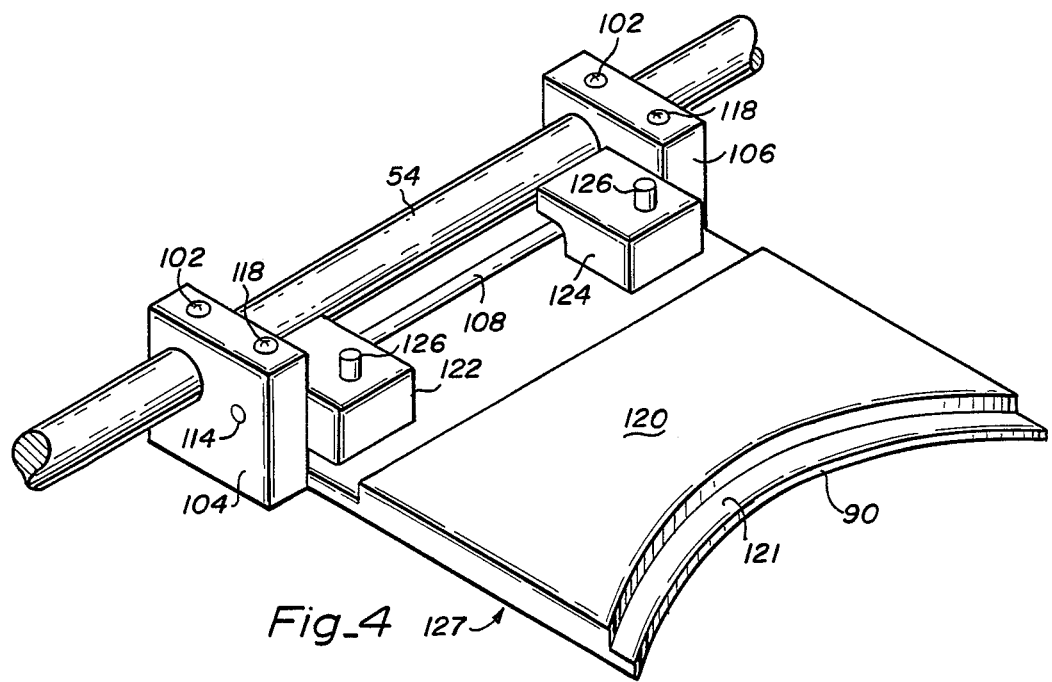
Fig_4
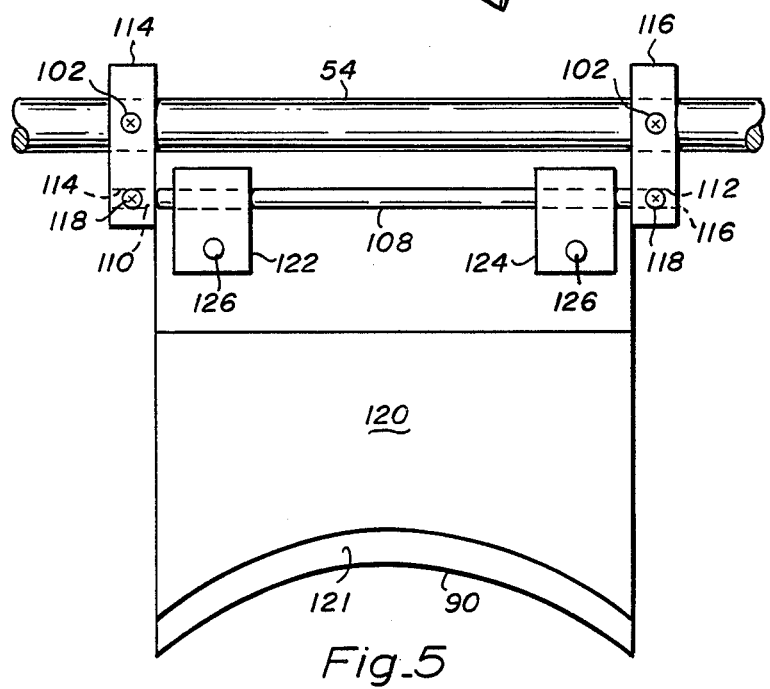
Fig_5

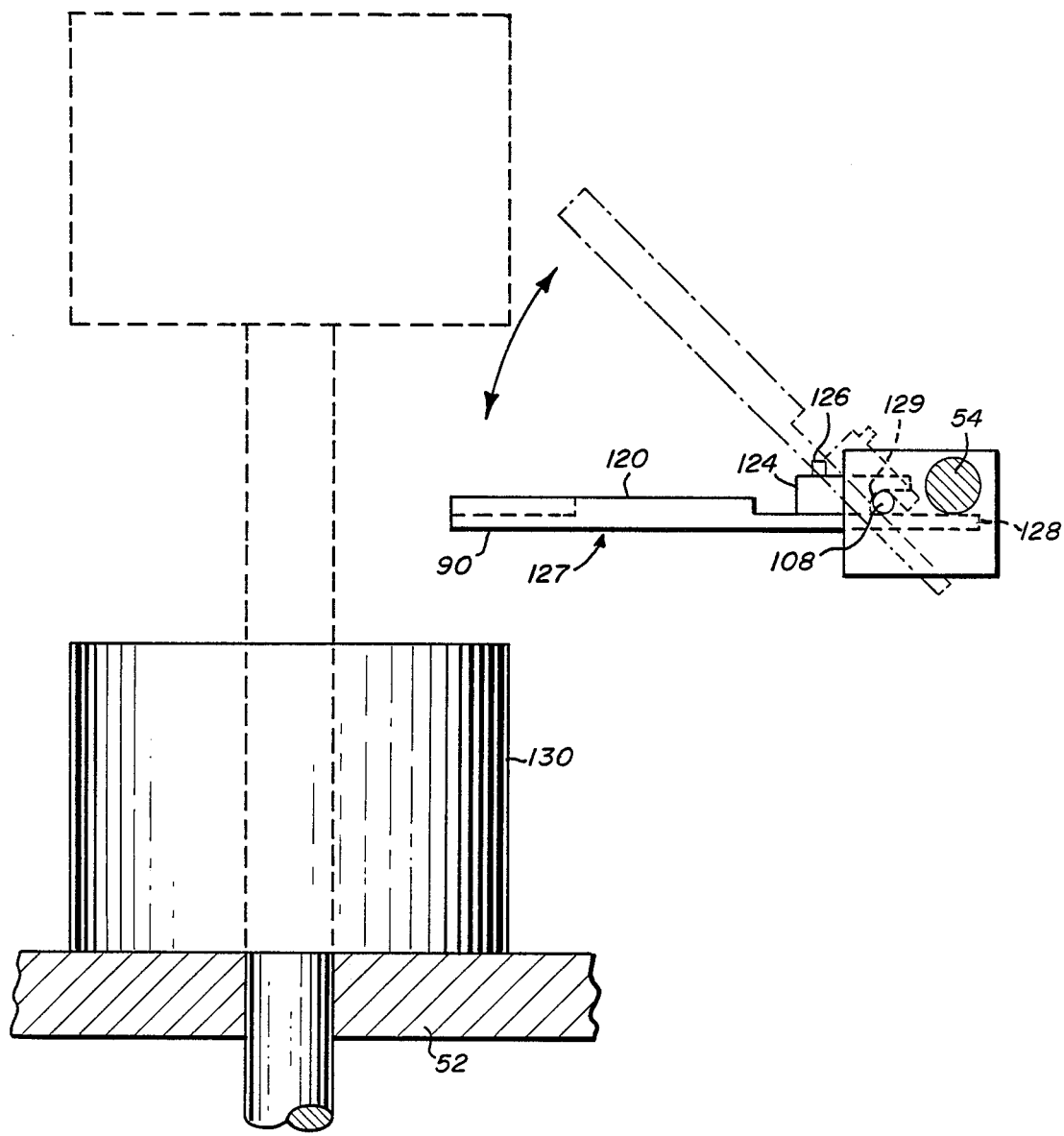
Fig_6

WAFER TRANSPORT SYSTEM

This application is a continuation, of application Ser. No. 381,022, filed May 24, 1982, now abandoned.

BACKGROUND OF THE INVENTION

1. Field of the Invention

The invention relates generally to wafer transport systems within in-line sputtering systems and more particularly to a wafer transport system wherein wafer movement is induced by movement of a magnet exterior to the sputtering system process chambers.

2. Description of the Prior Art

In the semiconductor industry, systems for transporting wafers between process locations in a sputtering system are well known. Typically circular silicon wafers of various diameters are moved between positions at which metallic coatings are sputtered onto the wafer or at which etching occurs. This process takes place in a vacuum chamber in order to eliminate contamination of the wafer surface. The goal of all such transport systems is to move the wafer from one process location to another.

Some systems use a chain drive conveyor-belt type of transport system. Such a drive system must be totally within the area subject to vacuum conditions or the driving means must penetrate the chamber in which a vacuum is being maintained. Both methods have significant drawbacks in that space is wasted where the drive means is entirely within the vacuum chamber thereby increasing the chamber's volume and thus the time it takes to evacuate the chamber. In the case of penetration of the chamber, there exists the possibility of drawing contamination into the chamber due to the presence of atmospheric pressure at the penetration site. It also requires complex and costly sealing mechanisms to prevent such in flow of contamination through drive mechanism penetrations.

Other transport systems known in the art include rotating the wafers through process locations or using a geared mechanism which pushes wafers from one location to another by means of disks which contact the wafers.

In short, the known wafer transport systems all use drive means whether belts, chains, gears or sprockets, which are either located in the process chamber or which penetrate such process chambers. Where such means are used contamination problems are present due either to the materials present on the drive means or by imperfect sealing of such penetrations.

Many of the existing sputtering systems using the transport systems described above use pneumatic pedestals which lift a wafer off the wafer transport system and into a position for the processing of the wafer. In many cases the devices which support the wafer during transport are rigidly fixed to the movement means of the particular transport system. This permits the wafer support device to be damaged if it is improperly positioned over a pneumatic pedestal. In such a case, when the pedestal is raised, it strikes the support device damaging the pedestal, the support device or both. Also, systems with such rigidly fixed support devices cannot be readily adapted to carry wafers of various diameters. Delay is caused by having to disassemble the transport system and install new support devices for the new diameter wafers to be processed.

SUMMARY OF THE PRESENT INVENTION

It is therefore an object of the present invention to provide a wafer transport system which eliminates penetrations in a process chamber for the drive means of the transport system.

It is a further object to provide a wafer transport system in which the drive means is completely located outside a process chamber.

It is a further object to eliminate the contamination of a process chamber caused by drive mechanisms located within the process chamber or by penetrations of the process chamber by the drive means.

It is a further object to provide a wafer support arm which will prevent damage to itself due to improper positioning of the wafer transport system with respect to pneumatic pedestals within the in line sputtering system.

It is a further object to provide wafer support arms which can be rapidly changed to accommodate various sizes of wafers.

Briefly, an embodiment of the present invention includes a first magnet located outside the process chamber and attached to any means which will cause the magnet to be moved in a longitudinal plane perpendicular to the wall of the process chamber. A second magnet is located inside the process chamber adjacent to the first magnet and in an alignment such that an attraction force exists between the magnets. The second magnet is rigidly fixed to a pair of parallel transport rails which support wafer support arms. Each transport rail is connected by a bearing means to a guide rail which permits the transport rails to move in a horizontal plane in response to movement of the first magnet which causes the second magnet to follow its movement. The support arms can rotate about a pivot rod which is fixed to the transport rails and can be removed by being rotated to a vertical position and lifted off.

An advantage of the present invention is that it provides a wafer transport system which eliminates the need of penetrations into a process chamber for the drive means of the transport system.

Another advantage of the present invention is that it provides a wafer transport system in which the drive means is completely located outside a process chamber.

Another advantage of the present invention is that it eliminates the contamination of a process chamber caused by wafer transport system drive mechanisms located within the process chamber or by the penetrations of the process chamber by the drive means.

Another advantage of the present invention is that it provides a wafer support arm which prevents damage to itself due to improper positioning of the wafer transport system with respect to pneumatic pedestals with the in-line sputtering system.

Yet another advantage of the present invention is that it provides wafer support arms which can be rapidly changed to accommodate various sizes of wafers.

These and other objects and advantages of the present invention will no doubt become obvious to those of ordinary skill in the art after having read the following detailed description of the preferred embodiment which is illustrated in the various drawing figures.

IN THE DRAWING

FIG. 1 is a top elevational view of a wafer transport system looking at the interior with the top removed in accordance with the present invention;

FIG. 2 is a side elevational view of a wafer transport system looking at the interior with the front removed;

FIG. 3 is a perspective view of the interior magnet assembly and its connection to the guide and transport rails;

FIG. 4 is a perspective view of a wafer support arm;

FIG. 5 is a top elevational view of a wafer support arm; and

FIG. 6 is a side elevational view of a wafer support arm.

DETAILED DESCRIPTION OF THE PREFERRED EMBODIMENT

In FIGS. 1 and 3 there is illustrated the top view of a wafer transport system referred to by the general reference numeral 10 and incorporating the present invention. The wafer transport system 10 includes a first magnet member 12 mounted on a pistonless pneumatic table 14 by a plurality of fasteners 15 through a first upper plate 16. The first magnet 12 and the pistonless pneumatic table 14 are located exterior to a process chamber wall 18. Inside wall 18 of a process chamber 20, a second magnet 22 is positioned directly adjacent to first magnet 12. The second magnet 22 (see FIG. 3) is mounted on a lower plate 24 by a plurality of fasteners 26 through a second upper plate 28 and the second magnet 22 forming an interior magnet assembly 30. The interior magnet assembly 30 is mounted on a first guide/transport connection plate 32 by fasteners 34 so that the second magnet 22 extends over the edge of first guide/transport connection plate 32. Connection plate 32 is attached to a first bearing block 36 by fasteners 38. In the longitudinal center of the first bearing block 36 is a first cylindrical bearing 40 which runs the length of the first bearing block 36 (see FIG. 3). A first guide rail 42 which is cylindrical and of a slightly smaller diameter than the first bearing 40 runs axially through the first bearing block 36.

A first end 44 and a second end 46 of the first guide 42 are secured in a first guide rail support 48 and a second guide rail support 50, respectively. The first and second guide rail supports 48 and 50 are rigidly fixed to a floor 52 (see FIG. 2) of the process chamber 20, thus providing partial support for the first guide/transport connection plate 32.

The first guide/transport connection plate 32 is connected to a first transport rail 54 by fasteners 56. A first end 58 of first transport rail 54 is connected to a first end 60 of a second transport rail 62 through a transport rail connection piece 64 by fasteners 66. The second transport rail 62 is connected to a second guide/transport connection plate 68 by fasteners 70, thus providing the remaining support necessary for second magnet 22.

Arranged along first and second transport rails 54 and 62 extending inward are a first, a second and a third wafer support assembly 84, 86 and 88. Each of the asemblies 84, 86 and 88 are adapted to support a wafer 89 as illustrated in FIG. 1 wherein assembly 84 is shown as supporting such a wafer. The wafer support assemblies 84, 86 and 88 comprise a first support arm 90, 92 and 94 and a second support arm 96, 98 and 100, respectively.

First support arm 90 is illustrated in FIG. 4. Each remaining support arm is constructed and operates in a manner similar to first support arm 90 which will be described below. First support arm 90 is connected to first transport rail 54 by fasteners 102 through a first and second transport rail/pivot rod connector 104 and 106. The second quide/transport connection plate 68 is attached to a second bearing block 72 (shown in phantom in FIG. 1) by fasteners 74 in a manner similar to that shown in FIG. 3 for the first bearing block 36. Second bearing block 72 contains a second cylindrical bearing 76 running through its longitudinal center.

As similarly described above for first bearing block 36 and first cylindrical bearing 40, a second guide rail 78 of slightly smaller diameter than the second cylindrical bearing 76 runs axially through second bearing block 72 in a manner similar to that described for first guide rail 54. A first end 80 and a second end 82 of second guide rail 78 are attached to the first and second guide rail supports 48 and 50 which in turn is rigidly attached to floor 52 of process chamber 20, a pivot rod 108 (see FIGS. 4 and 5) equal in length to the separation between the first and second transport rail connectors with a first end and second end 110 and 112 fitting into a first and a second hole 114 and 116 in first and second transport rail/pivot rod connectors 104 and 106, which are secured to pivot rod 108 by fasteners 118.

A wafer holder 120 (see FIGS. 4 and 6) with a lip 121 is connected to a first and second hinge block 122 and 124 by fasteners 126 to form a wafer holder hinge assembly 127. As illustrated in FIG. 6, the hinge blocks 122 and 124 are situated on the wafer holder 120 such that a first edge 128 of wafer holder 120 is flush with a vertical tangent extending downward from the outer side of transport rail 54 and so that a cutout portion 129 of hinge blocks 122 and 124 (shown for 124 only) covers pivot rod 108. Thus assembled, the wafer holder hinge assembly 127 is maintained in a horizontal position by first edge 128 being held against transport rail 54 by the weight of the first support arm 90 on the opposite side of the pivot rod 108 with the pivot rod 108 acting as a fulcrum. This forces edge 128 against the rail 54 which serves as a stop.

To operate wafer transport system 10, the pneumatic pistonless table 14 is activated causing first magnet 12 to be moved exterior to the process chamber wall 16. First magnet 12 and second magnet 22 are magnetically coupled by the magnetic attraction between the two. Therefore, when the first magnet 12 is moved along the exterior of process chamber 20, the second magnet 22 will tend to follow its motion if not restrained. The second magnet 22 follows the motion of first magnet 12 through the mechanical connection of the second magnet to parallel transport rails 54 and 62 which in turn are mechanically supported by a pair of fixed guide rails 42 and 78 through a pair of cylindrical bearings 40 and 76. Thus, the second magnet 22 is permitted to move to a position within the process chamber 20 which corresponds exactly with the first magnet's 12 exterior position. Arranged on the transport rails 54 and 62 are wafer support assemblies 84, 86 and 88 (while only three wafer support assemblies are used in the preferred embodiment there is no reason why a greater or lesser number of such assemblies could not be used). The wafer support assemblies 84, 86 and 88 are spaced such that the distance between them corresponds to the distance between process stations (not shown within the process chamber 20). By adjusting the amount of movement of this first magnet 12, the operator can precisely position the wafer supports' assemblies 84, 86 and 88 at the various process stations within the process chamber 20.

In the embodiment 10, there are four process stations, two in the process chamber and one each in the entry chamber and exit chamber, respectively. At each such station, there is a hydraulic pedestal 130, 132, 134 and 136 which is in its lowered position when the wafer transport system 10 is in operation. After the transport system 10 has positioned the wafer support assemblies 84, 86 and 88 carrying wafers (only one shown in FIG. 1 as wafer 89) over the pneumatic pedestals 130, 132, 134 and 136 (see FIG. 2), the pedestals are raised, thereby lifting the wafers off the wafer support assemblies and into a position where the desired process can take place.

In the event that the wafer support assemblies 84, 86 and 88 are improperly positioned such that support arms 90, 92, 94, 96, 98 and 100 is over the pneumatic pedestal 130, 132 or 134, such support arm will pivot about pivot rod 108 as shown in FIG. 6 when the pedestal is raised and comes into contact with the support arm, thus preventing damage to the wafer transport system 10.

Additionally, the fact that the wafer support arms 90, 92, 94, 96, 98 and 100 are not rigidly fixed, the transport rails 54 and 62 permits the rapid change of supports from those which carry one diameter wafers to supports which carry different diameter wafers. This is accomplished by rotating the wafer support arms 90, 92, 94, 96, 98 and 100 to a vertical position and lifting it off pivot rod 108. The process is reversed when inserting a new wafer support arm.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A wafer transport system comprising in combination:

transport means for carrying a member in translational motion;

a first magnet coupled to said transport means;

a second magnet mounted on a first plate, said first plate being connected to a fixed first guide rail by a bearing means permitting translational motion in a single plane;

a first transport rail adjacent and parallel to the first guide rail and rigidly connected to said first plate;

a second transport rail adjacent and parallel to the first transport rail and rigidly connected to the first transport rail fixing the first and second transport rails in the same plane as said first plate;

a second plate rigidly connected to the second transport rail;

a second fixed guide rail connected to said second plate by a bearing means to permit motion in a single plane;

a first, second, and third pair of wafer support arms with the first arm of a given pair pivotally mounted to the first transport rail and the second arm pivotally mounted to the second transport rail at a position directly opposite the first arm; and a lifting means for taking a wafer off the wafer support arms and returning a wafer to the wafer support arms;

whereby movement of the first magnet causes movement of the second magnet thereby causing the first and second transport rails to move in the same direction and distance as the first magnet thereby positioning the wafer support arms in a desired position with respect to the lifting means.

2. The wafer transport system of claim 1 wherein, the first and second magnets are permanent magnets.

3. The wafer transport system of claim 1 wherein, the first and second guide rails and the first and second transport rails are cylindrical.

4. The wafer transport system of claim 1 wherein, the first and second guide rails are of equal length.

5. The wafer transport system of claim 1 wherein, the first and second transport rails are of equal length.

6. A wafer transport system comprising in combination:

transport drive means;

a first plate connected to a fixed first guide rail by a bearing means permitting translational motion in a single plane;

means for coupling said transport means to said first plate;

a first transport rail adjacent and parallel to said first guide rail and rigidly connected to said first plate;

a second transport rail adjacent and parallel to said first transport rail and rigidly connected to said first transport rail fixing said first and second transport rails in the same plane as said first plate;

a second plate rigidly connected to said second transport rail;

a second fixed guide rail connected to said second plate by a bearing means to permit motion in a single plane;

a first, second and third pair of wafer support arms with the first arm of a given pair pivotally mounted to said first transport rail and the second arm pivotally mounted to said second transport rail at a position directly opposite the first arm; and a lifting means for taking a wafer off said wafer support arms and returning a wafer to said wafer support arms;

whereby said transport drive means causes movement of said first plate thereby causing said first and second transport rails to move in the same direction and distance as said first plate thereby positioning said wafer support arms in a desired position with respect to said lifting means.

7. The wafer transport system of claim 6 wherein, the first and second guide rails and the first and second transport rails are cylindrical.

8. The wafer transport system of claim 6 wherein, the first and second guide rails are of equal length.

9. The wafer transport system of claim 6 wherein, the first and second transport rails are of equal length.

* * * * *